United States Patent [19]

Galburt et al.

[11] Patent Number: 5,285,142
[45] Date of Patent: Feb. 8, 1994

[54] WAFER STAGE WITH REFERENCE SURFACE

[75] Inventors: Daniel N. Galburt, Wilton; Geoffrey O'Connor, Fairfield, both of Conn.

[73] Assignee: SVG Lithography Systems, Inc., Wilton, Conn.

[21] Appl. No.: 15,520

[22] Filed: Feb. 9, 1993

[51] Int. Cl.⁵ ............................................. G05B 11/00
[52] U.S. Cl. .................... 318/640; 318/647; 318/567; 356/401
[58] Field of Search ........ 318/647, 653, 567, 560–646, 318/687, 38; 378/132, 133; 355/53, 77, 78, 54, 86, 95; 250/548; 356/401, 363, 399, 400

[56] References Cited

U.S. PATENT DOCUMENTS

| | | | |
|---|---|---|---|
| 4,223,257 | 9/1980 | Miller | 318/594 |
| 4,654,571 | 3/1987 | Hinds | 318/687 |
| 4,676,649 | 6/1987 | Phillips | 356/401 |
| 4,742,286 | 5/1988 | Phillips | 318/640 |
| 4,952,858 | 8/1990 | Galburt . | |
| 5,040,431 | 8/1991 | Sakino et al. | 74/479 |

*Primary Examiner*—Paul Ip
*Attorney, Agent, or Firm*—Paul A. Fattibene

[57] ABSTRACT

An electromagnetic sub-stage and an electromagnetic monolithic stage coupled such that one follows the other having a single reference surface positioned therebetween. A sub-stage having linear motors for movement in the X-Y direction is mounted by a U bracket to a monolithic stage. The monolithic stage is suspended by flat electromagnetic coils providing precise motion of the body of the monolithic stage in X, Y, Z, and rotation about the Z axis or θ. Follow control means links or tracks the movement of the monolithic stage to the sub-stage such that the monolithic stage positioning coils are centered in their respective magnetic structure. Adjustable mechanical stops attached the monolithic stage in combination with air bearings riding on the reference surface limit travel of the monolithic stage in the focus or Z direction. The single reference surface extends over the entire range of motion of the monolithic stage. This improves position accuracy, and cleaning and servicing of the apparatus. The modular nature of the monolithic stage permits easy removal for inspection and repair.

11 Claims, 3 Drawing Sheets

WAFER STAGE WITH REFERENCE SURFACE

BACKGROUND OF THE INVENTION

1. Field of the Invention

This invention relates generally to semiconductor manufacturing and more particularly to an electromagnetic wafer stage for aligning and positioning a wafer in a microlithography system.

2. Description of Related Art

In the modern manufacture of semiconductor wafers using microlithography, it is necessary to accurately position and align semiconductor wafers on which circuit patterns are formed. As the feature size of the elements reproduced on a semiconductor wafer become ever smaller, the demands on the mechanical positioning and aligning of the wafer increase. A wafer stage used in aligning and positioning a wafer is disclosed in U.S. Pat. No. 4,952,858 entitled "Microlithographic Apparatus" issuing Aug. 28, 1990 to Daniel N. Galburt, the same inventor as the present invention. Therein disclosed is an electromagnetic alignment apparatus including a monolithic stage, a sub-stage and an isolated reference structure. Force actuators are interposed between the monolithic stage and the sub-stage for suspending and positioning the monolithic stage. Means for controlling a position of the sub-stage to follow the approximate position of the monolithic stage is also disclosed.

While the invention disclosed in U.S. Pat. No. 4,952,858 has accomplished its intended purpose, there is an ever increasing need to provide a wafer stage with better performance and more accurate and repeatable positioning. This is especially true in view of the ever decreasing feature sizes placed on the semiconductor wafers.

SUMMARY OF THE INVENTION

The present invention is directed to a wafer stage having a sub-stage movable in the X-Y direction, and a monolithic stage having a wafer chuck thereon coupled to the sub-stage. An ultra flat focus reference surface is located between the sub-stage and the monolithic stage. Suspension means are used for suspending and positioning the monolithic stage over the reference surface. The reference surface extends over the entire range of travel of the monolithic stage and sub-stage. Air bearings ride on the reference surface providing mechanical stops limiting the distance of travel of the monolithic stage from the reference surface.

Accordingly, it is an object of the present invention to provide a wafer stage with extended X-Y direction travel.

It is another object of the present invention to provide a more accurate and precise wafer stage.

It is an advantage of the present invention that it is easily maintained and adjusted.

It is another object of the present invention that the range of travel of the monolithic stage from a reference surface is limited to a predetermined distance by mechanical stops.

It is a feature of the present invention that a large flat reference surface is placed between the sub-stage and the monolithic stage.

It is yet another feature of the present invention that air bearings are used as a mechanical stop.

These and other objects, advantages, and features will become readily apparent in view of the following more detailed description.

DESCRIPTION OF THE PREFERRED EMBODIMENT

Figure 1:
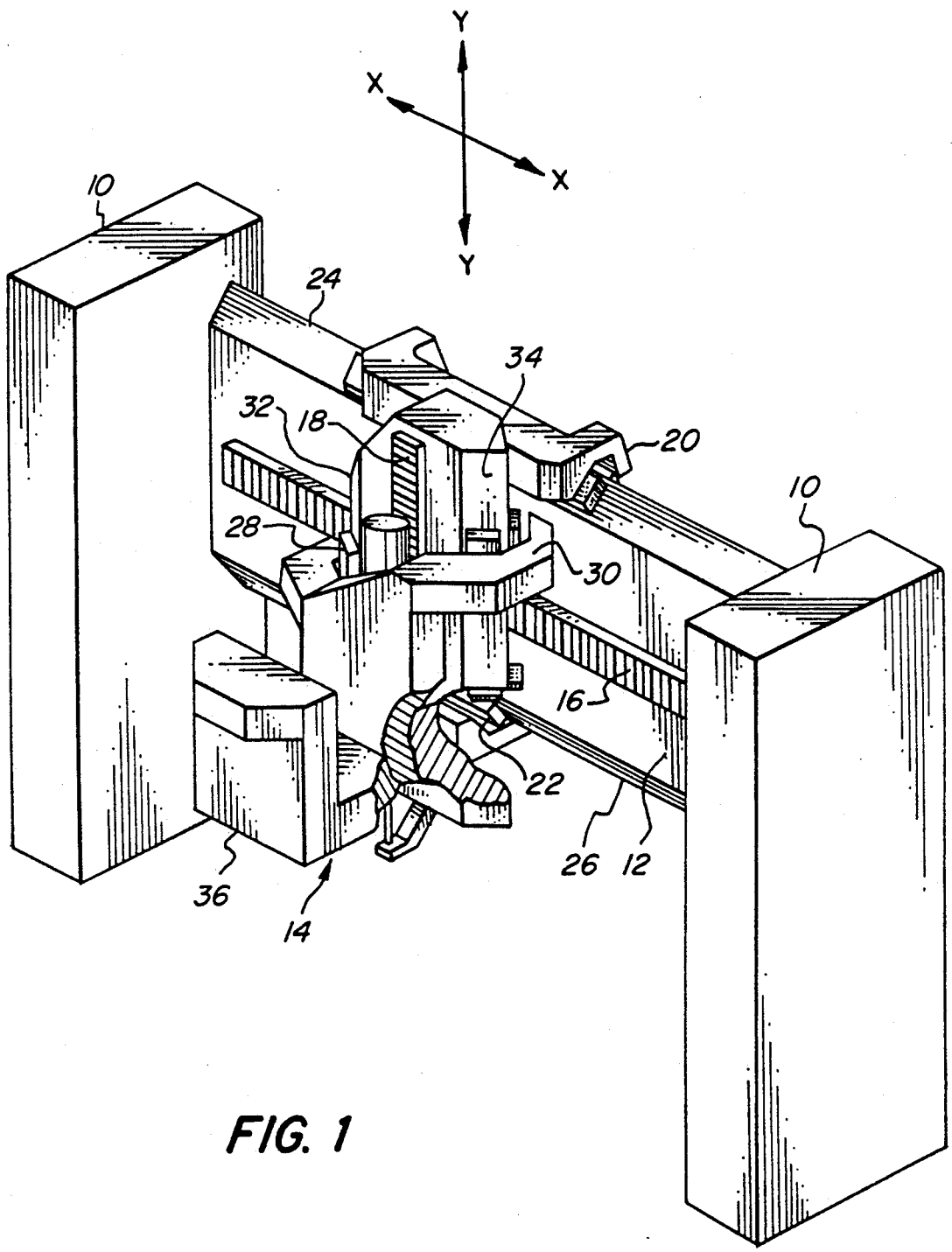
FIG. 1 is a perspective view illustrating the sub-stage.

FIG. 1 illustrates the sub-stage of the present invention. A base frame 10 has a beam 12 attached thereto. Sub-stage 14 rides on the beam 12. Movement in the X direction is controlled by a linear motor 16, and movement in the Y direction is controlled by linear motor 18. The sub-stage 14 rides on air bearings. Movement in the X direction is guided by an upper air bearing 20 and a lower air bearing 22. The air bearing 20 rides on an angled upper air bearing track 24, and the lower air bearing 22 rides on an angled lower air bearing track 26. Movement of the sub-stage 14 in the Y direction is guided by a left air bearing 28 and a right air bearing 30. Left air bearing 28 rides on an angled left air bearing track 32, and right air bearing 30 rides on an angled right air bearing track 34. Thereby, the sub-stage 14 is controllably moved to any desired X-Y location within the range of the linear motors 16 and 18. A U-shaped bracket 36 is connected to the sub-stage 14. A portion of the weight of the bracket and sub-stage 14 is countered by sub-stage counter force means 38.

Figure 2:
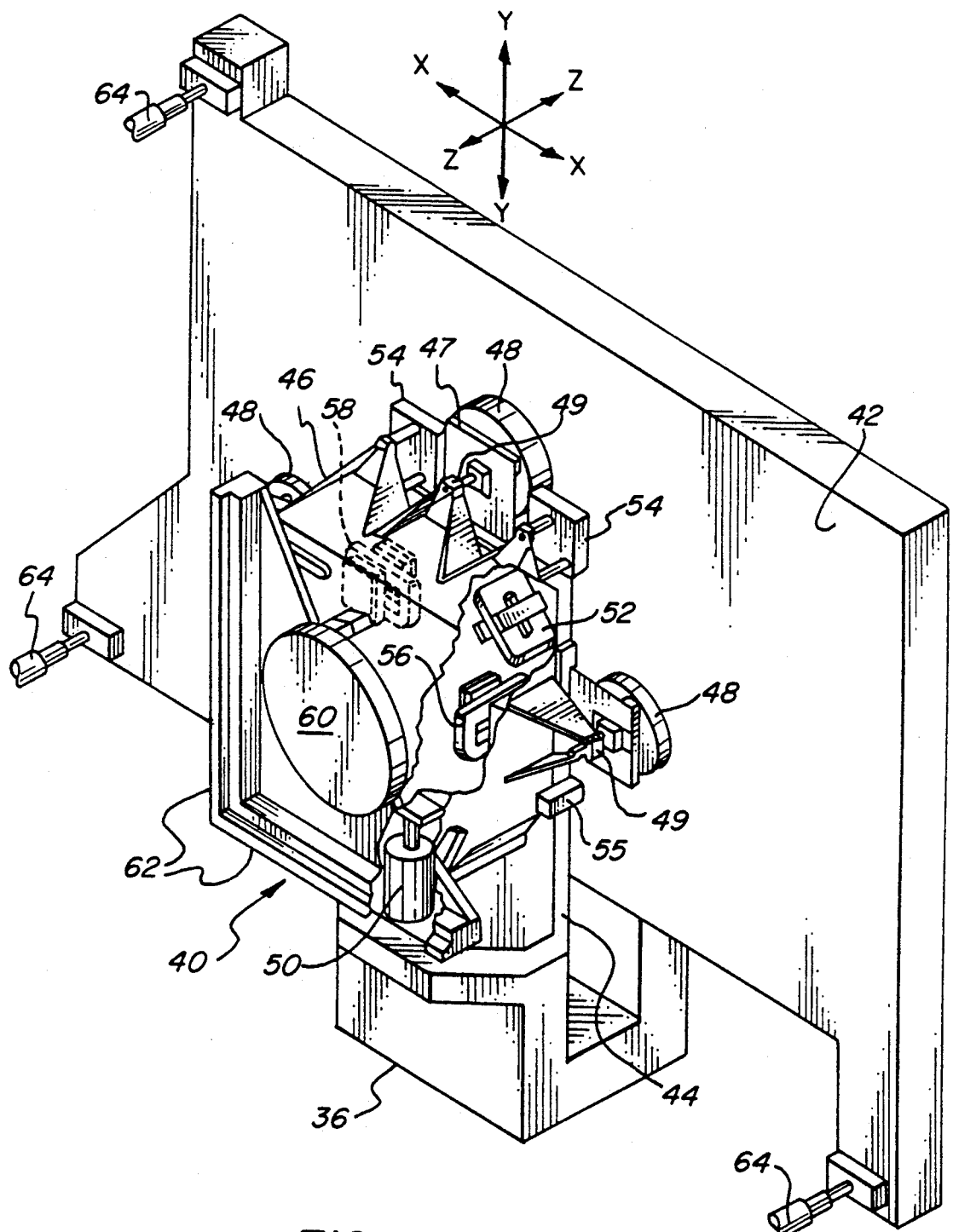
FIG. 2 is a perspective view having a partial section illustrating the monolithic stage.

FIG. 2 illustrates the monolithic stage 40 coupled to the U-shaped bracket 36, and the reference surface 42. Reference surface 42 is placed between the sub-stage 14 illustrated in FIG. 1 and the monolithic stage 40. A coil plate 44 is rigidly attached to the U-shaped bracket 36. The monolithic body 46 of monolithic stage 40 is coupled to the coil plate 44 by four electromagnetic coils 56 and 58. Two electromagnetic coil 56 controls relative motion of the monolithic body 46 in the Y direction. Only one of the two coils 56 is illustrated in the cut-away portion in FIG. 2. Another coil 56 is located adjacent the side opposite of the coil 56 illustrated. Two electromagnetic coils 58 control the relative movement of the monolithic body 46 in the X direction. Only one coil 58 is illustrated in the cut-away portion in FIG. 2. The other coil 58 is located adjacent the side opposite the coil 58 illustrated. Four electromagnetic focus coils 52 are positioned at each corner of the monolithic body 46. Only one focus coil 52 is illustrated in the cut-away portion in FIG. 2. The focus coils 52 move the monolithic body 46 in the focus or Z direction. The focus coils 52 therefore control the distance of the monolithic body 46 from the reference surface 42. The weight of monolithic body 46 is compensated for by monolithic counter force means 50. Three air bearings 48, only two being illustrated in FIG. 2, glide on the reference surface 42. Three cap gauges 54, only two being illustrated in the perspective view in FIG. 2, are used to detect the position of the monolithic body 46 of the monolithic stage 40 on the Z axis. The air bearings 48 are attached to the monolithic body 46 by three flexures 47. Associated with air bearings 48, and attached to the monolithic body 46 are three mechanical stops 49. Only two of the three mechanical stops 49 are illustrated in FIG. 2. The third mechanical stop is on the side hidden from view by the interferometer mirror 62 in FIG. 2. The mechanical stops 49 are adjustable and prevent the monolithic body 46 from moving out of a predetermined range of travel along the Z axis. This prevents unintentional contact with the surface 42 or projection optics, not illustrated. The structure of the monolithic stage and the controls and coupling to the sub-stage are similar to those disclosed in U.S. Pat. No. 4,952,858, which is herein incorporated by reference. Attached to the monolithic body 46 is a wafer chuck 60. Laser gauges, not shown, are used in conjunction with interferometer mirrors 62 to accurately ascertain the position of the monolithic body 46 of the monolithic stage 40. Relative position sensor means 55 is associated with the coil plate 44 attached to the sub-stage 14, illustrated in FIG. 1, and the monolithic body 46 to detect the relative position between the monolithic body 46 and coil plate 44, which is attached to the sub-stage 14 by U-shaped bracket 36. Damped, flexured, differential rods 64 are used to adjust and maintain the positioning of the reference surface 42.

Figure 3:
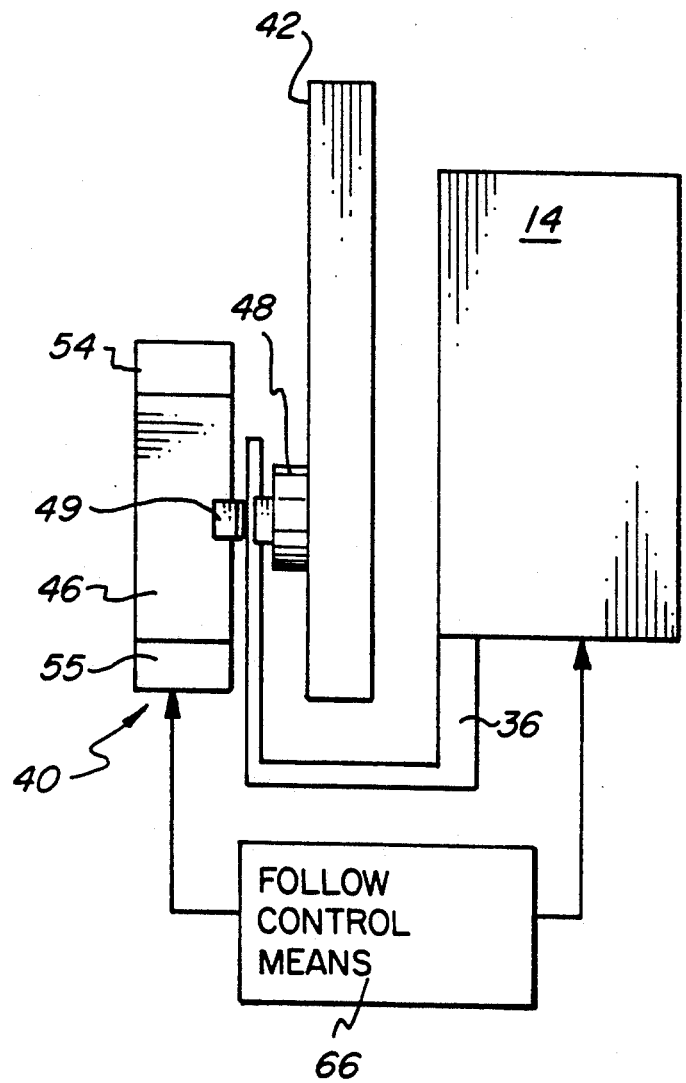
FIG. 3 is a schematic representation of the present invention.

FIG. 3 schematically represents the operation of the present invention. The reference surface 42 is positioned between the sub-stage 14 and the monolithic stage 40. Focus or Z sensor 54 is used to detect the distance between the reference surface 42 and the monolithic stage 40. Relative position sensor means 55 is associated with the monolithic stage 40 and the sub-stage 14 through U-shaped bracket 36 in order to detect the relative position of the monolithic stage 40 and the sub-stage 14. Follow control means 66 is coupled to the sub-stage 14, the relative position sensor means 55, and the monolithic stage 40. The follow control means 66 provides a means for controlling the position of the sub-stage 14 to follow the approximate position of the monolithic stage 40. Therefore, the monolithic stage 40 is servo controlled, and the sub-stage 14 tracks the position of the monolithic stage 40 to keep the monolithic stage centered in a predetermined position. The predetermined position is typically a position where the coils 56 and 58, illustrated in FIG. 2, are centered within their associated magnetic structures. Stop 49 and air bearing 48 limit travel of the monolithic stage 40 to a predetermined range preventing the possibility of striking the reference surface, projection optics, not shown, or any other nearby structure.

Therefore, the wafer stage of the present invention provides for improved focusing and positioning accuracy in addition to providing a greater range of travel. The greater range of travel improves operation and permits easier cleaning and servicing of the monolithic stage. Additionally, the monolithic stage can be readily removed for inspection and repair.

Although the preferred embodiment has been illustrated, it will be obvious to those skilled in the art that various modifications may be made without departing from the spirit and scope of this invention.

What is claimed:

1. An electromagnetic alignment apparatus comprising:
    a base;
    a sub-stage riding on said base;
    motor means, associated with said sub-stage, for controlling the position of said sub-stage;
    a monolithic stage;
    a reference surface beneath said monolithic stage;
    a bracket attached to said sub-stage at one end and said monolithic stage at the other end;
    suspension means, mounted on the said monolithic stage, for suspending and positioning said monolithic stage over said reference surface;
    stop means, associated with said monolithic stage and said reference surface, for keeping said monolithic stage within a predetermined distance from said reference surface;
    sensing means, associated with said monolithic stage, for sensing the position of said monolithic stage; and
    follow control means, associated with said sub-stage, said monolithic stage, and said sending means, for controlling the position of said sub-stage to follow the approximate position of said monolithic stage.

2. An electromagnetic alignment apparatus as in claim 1 wherein said stop means includes:
    at least one mechanical stop attached to said monolithic stage; and
    at least one air bearing attached to said substage and riding on said reference surface.

3. An electromagnetic alignment apparatus comprising:
    a base;
    a sub-stage riding on said base;
    motor means, associated with said sub-stage, for controlling the position of said sub-stage;
    a monolithic stage;
    a reference surface positioned between said sub-stage and said monolithic stage;
    a U-shaped bracket attached to said sub-stage at one end and said monolithic stage at the other end;
    suspension means, mounted on the said monolithic stage, for suspending and positioning said monolithic stage over said reference surface;
    stop means, associated with said monolithic stage and said reference surface, for keeping said monolithic stage within a predetermined distance from said reference surface;
    sensing means, associated with said monolithic stage, for sensing the position of said monolithic stage; and
    follow control means, associated with said sub-stage, said monolithic stage, and said sensing means, for controlling the position of said sub-stage to follow the approximate position of said monolithic stage.

4. An electromagnetic alignment apparatus as in claim 1 wherein said motor means comprises:
    a first linear motor moving in the X direction; and
    a second linear motor moving in the Y direction.

5. An electromagnetic alignment apparatus as in claim 4 wherein said suspension means comprises:
    a plurality of electromagnetic coils.

6. An electromagnetic alignment apparatus as in claim 5 wherein said plurality of electromagnetic coils includes:
    at least two x direction positioning coils;
    at least two Y direction positioning coils; and
    at least four z direction positioning coils.

7. An electromagnetic alignment apparatus comprising:
    a base;
    a sub-stage riding on said base;
    a first linear motor, associated with said sub-stage, moving in the X direction;
    a second linear motor, associated with said sub-stage, moving in the Y direction;
    a monolithic stage;

a reference surface positioned between said sub-stage and said monolithic stage;

a plurality of electromagnetic coils, mounted on said monolithic stage, including at least two X direction positioning coils, at least two Y direction positioning coils, and at least four Z direction positioning coils;

stop means, associated with said monolithic stage and said reference surface, for keeping said monolithic stage within a predetermined distance from said reference surface;

an interferometer detecting X-Y position of said monolithic stage, including rotation about the Z axis;

a cap gauge detecting the position of said monolithic stage along the Z axis; and relative position sensor means, associated with said sub-stage and said monolithic stage, for detecting the relative position between said sub-stage and said monolithic stage; and follow control means, associated with said sub-stage, said monolithic stage, and said sensing means, for controlling the position of said sub-stage to follow the approximate position of said monolithic stage.

8. An electromagnetic alignment apparatus comprising:

a base;

a sub-stage riding on said base;

motor means, associated with sub-stage, for controlling the position of said sub-stage;

a monolithic stage;

a reference surface positioned between said sub-stage and said monolithic stage, the plane formed by said reference surface being vertical;

suspension means, mounted on the said monolithic stage, for suspending and positioning said monolithic stage over said reference surface;

stop means, associated with said monolithic stage and said reference surface, for keeping said monolithic stage within a predetermined distance from said reference surface;

sensing means, associated with said monolithic stage, for sensing the position of said monolithic stage; and follow control means, associated with sub-stage, said monolithic stage, and said sensing means, for controlling the position of said sub-stage to follow the approximate position of said monolithic stage.

9. An electromagnetic alignment apparatus as in claim 8 further comprising:

sub-stage counter force means, attached to said sub-stage, for countering the weight of said sub-stage; and a monolithic counter force means, attached to said monolithic stage, for countering the weight of said monolithic stage.

10. An electromagnetic alignment apparatus for use in semiconductor manufacturing comprising:

a base frame having two legs;

a beam extending between the two legs of said base;

an X direction linear motor mounted on said beam;

a sub-stage mounted on said beam;

a Y direction linear motor mounted on a portion of said sub-stage;

a U-shaped bracket mounted on said sub-stage;

a coil plate mounted on said U-shaped bracket;

at least two Y direction electromagnetic coils mounted on said coil plate;

at least two X direction electromagnetic coils mounted on said coil plate;

at least four Z direction coils mounted on said coil plate;

a monolithic body suspended and positioned by said Y direction coils, X direction coils, and Z direction coils;

a wafer chuck attached to said monolithic body;

a single reference surface positioned between said monolithic body and said sub-stage, said reference surface being sufficiently large so as to encompass the entire range of motion of said sub-stage and said monolithic body;

at least three air bearings mounted on said coil plate positioned to glide along said reference surface;

X-Y direction position sensing means, associated with said monolithic body, for detecting the X-Y position, including rotation of said monolithic body;

Z direction sensing means, associated with said monolithic body for detecting displacement between said reference surface and said monolithic body;

relative position sensor means, associated with said coil plate and said monolithic body, for detecting relative position between said coil plate and said monolithic body; and follow control means, associated with said X direction linear motor, said Y direction linear motor, said Y direction coils, and said X direction coils, and said relative position sensor means, for tracking the position of said monolithic body to keep said monolithic body in a predetermined position relative to the range of motion of said Y direction coils and said X direction coils.

11. An electromagnetic alignment apparatus for use in semiconductor manufacturing as in claim 10 wherein:

the predetermined position is a position where said Y direction coils and said X direction coils are centered.

* * * * *